United States Patent
McAuliffe, Jr. et al.

(10) Patent No.: US 6,537,172 B1
(45) Date of Patent: Mar. 25, 2003

(54) ELECTRONICALLY ACTUATED MODULATABLE DIFFERENTIAL

(75) Inventors: Lawrence McAuliffe, Jr., Battle Creek, MI (US); Ross K. Cheadle, Wixom, MI (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 10/047,318

(22) Filed: Jan. 14, 2002

Related U.S. Application Data

(63) Continuation of application No. 09/982,647, filed on Oct. 18, 2001.

(51) Int. Cl.[7] .............................................. F16H 48/22
(52) U.S. Cl. ...................................... 475/150; 475/231
(58) Field of Search ................................ 475/150, 231; 192/35, 54.52, 84.7, 84.91

(56) References Cited

U.S. PATENT DOCUMENTS

| | | | | |
|---|---|---|---|---|
| 4,805,486 A | * | 2/1989 | Hagiwara et al. | ........... 475/231 |
| 4,838,118 A | * | 6/1989 | Binkley | ........................ 475/231 |
| 5,007,886 A | * | 4/1991 | Holmquist et al. | ......... 475/231 |
| 5,217,416 A | * | 6/1993 | Dick | ........................... 475/150 |
| 6,436,002 B1 | * | 8/2002 | Ishikawa et al. | ............ 475/231 |
| 6,460,677 B1 | * | 10/2002 | Roscoe | ........................ 475/150 |

* cited by examiner

Primary Examiner—Sherry Estremsky
(74) Attorney, Agent, or Firm—L. J. Kasper

(57) ABSTRACT

A differential gear mechanism of the limited slip type including a clutch pack (35) operable to retard rotation between the side gears (21,23) and the gear case (11). The clutch pack may be loaded, to retard differentiating action by means of a retarding mechanism (33) including a first ball ramp actuator (43) operable to cause axial movement of a plurality of elongated engagement members (61). When the members (61) move axially, a cone clutch assembly (79) is engaged, which retards rotation of a ramp plate (73) of a second ball ramp actuator (71). It is the ramping action of the second ball ramp actuator (71) which applies a load to the clutch pack (35) to limit, or prevent, differentiation within the differential gearing.

7 Claims, 4 Drawing Sheets

ELECTRONICALLY ACTUATED MODULATABLE DIFFERENTIAL

CROSS-REFERENCE TO RELATED APPLICATIONS

This application is a continuation of co-pending application U.S. Ser. No. 09/982,647, filed Oct. 18, 2001, in the name of Lawrence McAuliffe & Matthew P. Scarbrough for a "Electronically Actuated Modulatable Differential;".

BACKGROUND OF THE DISCLOSURE

The present invention relates to traction modifying devices, and more particularly, to such devices of the type which are capable of operating as limited slip differentials during at least part of their operating cycle. The present invention is preferably also capable of operating as a locking differential during part of its operating cycle, and when fully disengaged is capable of operating as an open differential, such that the differential of the present invention is preferably modulatable between open, limited slip and locking modes of operation.

Limited slip and locking differentials of the type to which the present invention relates typically include a gear case defining a gear chamber and disposed therein, a differential gear set including at least one input pinion gear and a pair of output side gears. A clutch pack is typically disposed between one of the side gears and an adjacent surface of the gear case, such that the clutch pack is operable to retard, or even prevent, rotation between the side gears and the gear case. In a typical locking differential, there is a cam means disposed between the clutch pack and its adjacent side gear, the cam means being operable to engage the clutch pack upon relative rotation of the cam members and exert sufficient force on the clutch pack to lock the differential. As used herein, the term "lock" refers to the ability to limit differentiating action of the gear set to the extent that no substantial differentiation occurs.

In many limited slip and locking differentials, some sort of actuating mechanism is provided to actuate or bias the clutch pack to its engaged condition. One of the current trends in the field of vehicle traction modifiers involves the desire to be able to actuate a clutch pack in response to an external signal (for example, an electrical signal generated by a vehicle microprocessor), rather than in response to the sensing of a predetermined speed differential. Actuating the clutch pack of a locking differential has been done in the prior art by a mechanical device, for example, by means of a flyweight mechanism. Such locking differentials of the "mechanical" type are sold commercially by the assignee of the present invention. Mechanical locking differentials of this type are illustrated and described in U.S. Pat. No. 4,389,909, assigned to the assignee of the present invention, and incorporated herein by reference.

As was mentioned previously, there is an increasing number of vehicle applications in which it is desirable to be able to begin to engage the clutch pack in response to an external signal, the signal preferably being an electrical input signal, in which case the typical actuation mechanism would comprise an electromagnetic coil. An example of the type of electromagnetic actuator which could be utilized, and receive an external electrical signal, is shown in U.S. Pat. No. 5,911,643, assigned to the assignee of the present invention and incorporated herein by reference. In the above-cited '643 patent, the electromagnetic coil is generally annular and is disposed in a face-to-face relationship with an adjacent ramp plate of a ball ramp actuator, such that energizing the coil initiates the ramp up of the ball ramp actuator.

In designing and developing limited slip and locking type traction modifiers, there are a number of different design criteria, but for purposes of the present invention, there are three which are of particular interest. The first is to be able to activate and deactivate the traction modifier very quickly. The second is being able to achieve the required axial force on the clutch pack to generate the desired "bias torque", i.e., the torque which is transferred from a spinning wheel (having poor traction) to the stationary wheel (having good traction). The third design criteria of interest in regard to the present invention is to be able to disengage the clutch pack, and the associated engagement and actuation mechanism, after the poor traction situation has occurred, when it is again acceptable for the differential to operate in an "open differential" mode, i.e., with little or no traction modification occurring, as opposed to the traction modifier remaining "stuck" in the locked mode as is known in regard to prior art devices.

Unfortunately, the kinds of modifications which would typically be made in the actuation mechanism of the differential, in order to increase the load applied to the clutch pack, and therefore, increase the bias torque, make it more difficult to disengage the clutch pack and the associated actuation mechanism. Conversely, the kinds of modifications that would normally be made to facilitate the disengagement of the clutch pack would typically result in a decreased load being applied to the clutch pack, and therefore, a decreased bias torque.

BRIEF SUMMARY OF THE INVENTION

Accordingly, it is an object of the present invention to provide an improved traction modifying differential in which the clutch pack may be actuated in response to an external electrical signal, wherein the differential overcomes the problems associated with the prior art devices.

More specifically, it is an object of the present invention to provide an improved traction modifying differential which is capable of applying a greater load to the clutch pack, but which still is capable of being easily disengaged.

It is another object of the present invention to provide an improved traction modifying differential which achieves the above-stated objects and, at the same time, is capable of being activated and deactivated more rapidly than prior art devices.

The above and other objects of the invention are accomplished by the provision of an improved differential gear mechanism of the type including a gear case and defining an axis of rotation and a gear chamber. A differential gear set is disposed in the gear chamber and includes at least one input gear and first and second output gears. A retarding mechanism for retarding differentiating action of the differential gear set includes a clutch pack disposed adjacent the second output gear, and operable between an engaged condition, effective to retard relative rotation between the output gears and the gear case, and a disengaged condition. The retarding mechanism includes a first ball ramp actuator disposed adjacent the first output gear and further includes an electromagnetic actuator disposed adjacent the first ball ramp actuator and operable, in response to an electrical input signal, to cause ramping action of the first ball ramp actuator. A plurality of elongated engagement members have upstream end portions generally associated with the first ball ramp actuator and are operable to move axially toward the second output gear in response to the ramping action of the first ball ramp actuator. The elongated engagement members have downstream end portions operably associated with a clutch pack loading mechanism and operable, in response to the axial movement of the engagement members to apply a load to the clutch pack tending to change the clutch pack from the disengaged condition to the engaged condition.

The improved differential gear mechanism is characterized by the clutch pack loading mechanism comprising a second ball ramp actuator disposed axially between the second output gear and the clutch pack, the second ball ramp actuator including a rotatable ramp plate. The clutch pack loading mechanism further comprises a cone clutch assembly comprising an input member, operably associated with the downstream end portions of the engagement members. The cone clutch assembly defines a first cone clutch surface and the rotatable ramp plate defines a mating, second cone clutch surface, the first and second cone clutch surfaces being moved toward engagement in response to the axial movement of the engagement members, to initiate ramping action of the second ball ramp actuator.

DETAILED DESCRIPTION OF THE PREFERRED EMBODIMENT

Figure 1:
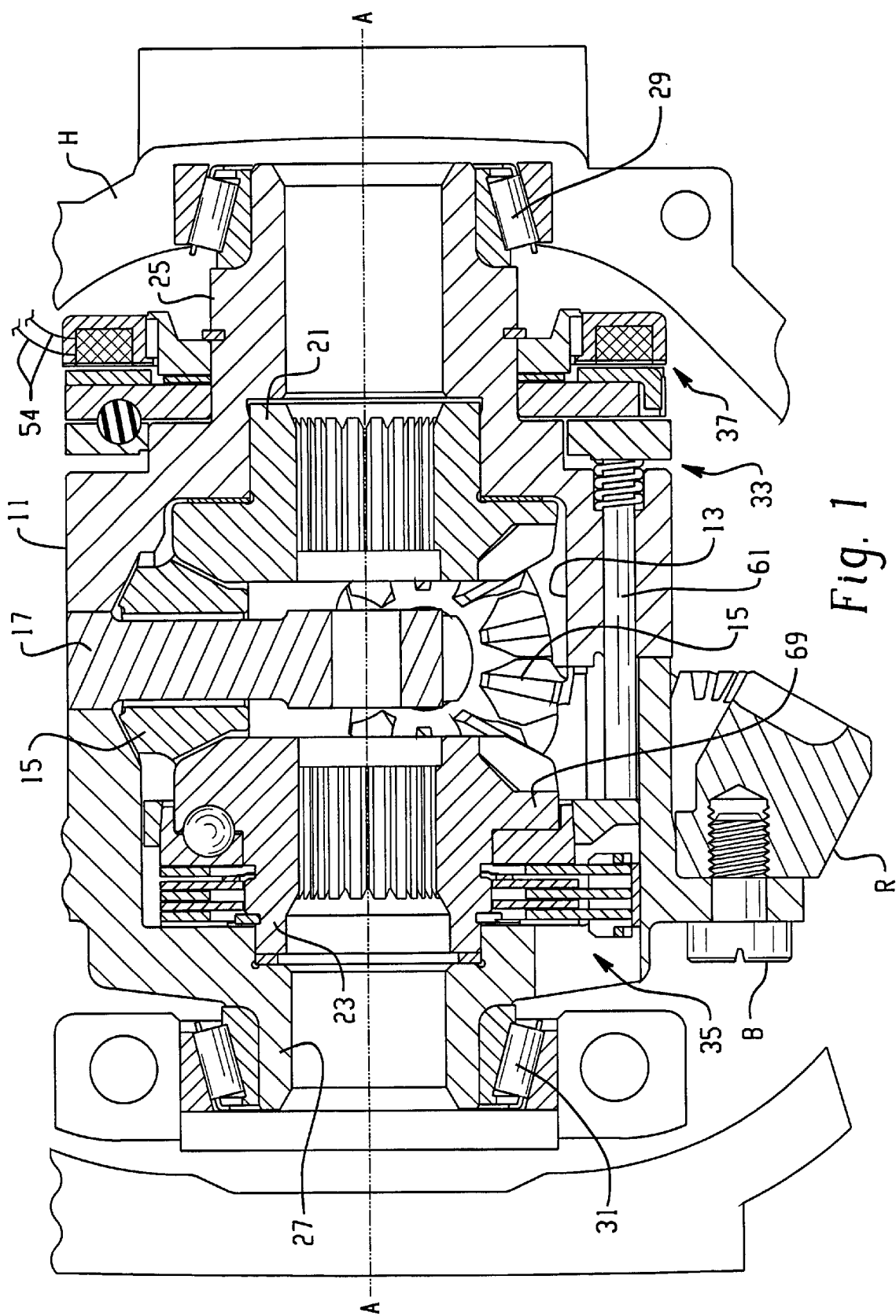
FIG. 1 is a fragmentary, axial cross-section of a traction modifying differential, made in accordance with the present invention.

Referring now to the drawings, which are not intended to limit the invention, FIG. 1 is an axial cross-section of a traction modifying differential incorporating the present invention. It is an essential feature of the present invention that the traction modifying differential shown in FIG. 1 be able to operate, in response to an external signal, as a limited slip differential. It is preferable that the differential of the present invention be able to operate, in appropriate circumstances, as an open differential. Finally, it is also preferable that the differential of the present invention be able to operate, under certain extreme conditions, as a locking differential. However, it would be within the scope of the present invention for the differential to operate only in a limited slip mode, varying between a relatively low bias torque and a relatively high bias torque (see FIG. 5).

The differential gear mechanism shown in FIG. 1 includes a gear case 11 which defines therein a gear chamber, generally designated 13. Torque input to the differential mechanism is typically by means of an input ring gear R which may be attached to the gear case 11 by means of a plurality of bolts B, only one of which is shown in FIG. 1. As is well know to those skilled in the art, the gear case 11 may comprise either two generally symmetrical case sections, as is shown in FIG. 1, or some other configuration, it being understood that the particular configuration of the gear case 11 is not an essential feature of the invention.

Disposed within the gear chamber 13 is a differential gear set including a plurality of planet pinions 15 rotatably mounted on a pinion shaft 17, which may be secured to the gear case 11 by any suitable means. The planet pinions 15 comprise the input gears of the differential gear set, and are in meshing engagement with a pair of side gears 21 and 23, which comprise the output gears of the differential gear set. The side gears 21 and 23 may also be referred to hereinafter as the "first" and "second" side gears, respectively, for reasons of ease of explanation only, as will become apparent subsequently. The side gears 21 and 23 define sets of internal splines for splined engagement with a pair of axle shafts (not shown herein). The gear case 11 includes an annular hub portion 25, disposed adjacent the first side gear 21, and an annular hub portions 27, disposed adjacent the side gear 23, the hub portions 25 and 27 being adapted to have mounted thereon a pair of bearing sets 29 and 31, respectively to provide rotational support for the differential mechanism relative to an outer differential housing H.

As is also well know to those skilled in the art, during normal, straight-ahead operation of the vehicle, no differentiation occurs between the left- and right-hand axle shafts, and therefore, no differentiation occurs between the side gears 21 and 23. As a result, the pinions 15 do not rotate relative to the pinion shaft 17, and therefore, the gear case 11, the pinions 15, and the side gears 21 and 23 all rotate about an axis of rotation A as a solid unit.

Under certain operating conditions, such as when the vehicle is turning, or a slight difference in the tire size exists, it is permissible for a certain amount of differentiating action to occur between the side gears 21 and 23. Above a certain, predetermined differential between the speeds of the side gears 21 and 23, it is desirable to retard the relative rotation between the side gears and the gear case 11, in order to prevent excessive differentiating action, in which case the differential is operating in a "limited slip" mode. There may also be operating conditions wherein it is desirable to lock up the differential mechanism, to prevent any substantial differentiating action, even before such has a chance to occur, in which case the differential is operating in the "locking differential" mode. It may also be desirable, under certain operating conditions, to lock up the differential mechanism in response to the sensing of a level of differentiating action between the axle shafts which exceeds a predetermined, maximum speed difference.

In order to retard differentiating action, the differential gear mechanism is provided with a retarding mechanism, generally designated 33, for retarding differentiating action of the differential gear set. The retarding mechanism 33 comprises a clutch pack, generally designated 35, disposed between the second side gear 23 and the gear case 11. The retarding mechanism 33 further comprises an actuating mechanism, generally designated 37, for initiating the actuation of the retarding mechanism 33.

Figure 2:
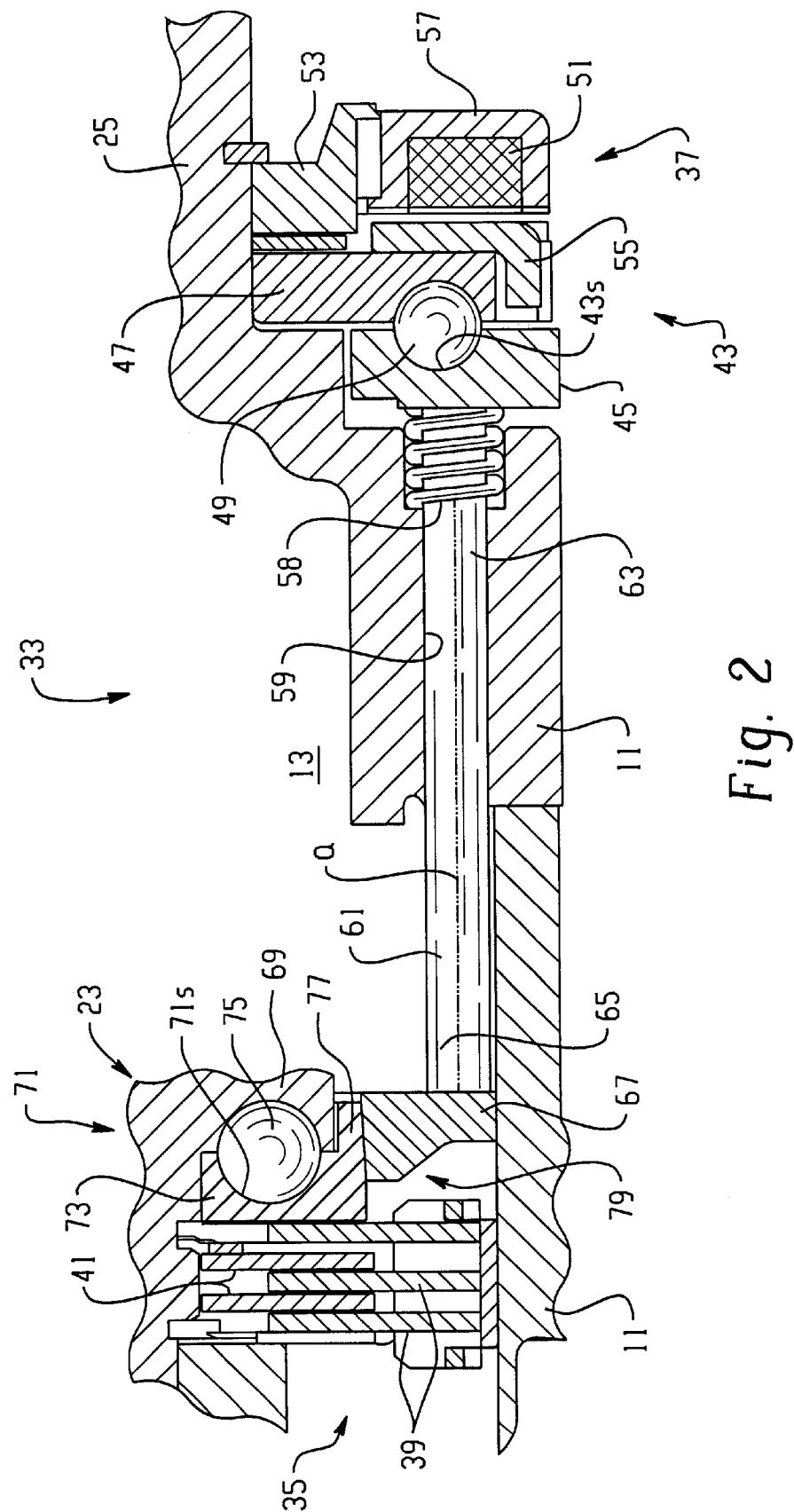
FIG. 2 is an enlarged, somewhat fragmentary view, similar to FIG. 1, but isolating, and showing substantially only the retarding mechanism and the clutch pack loading mechanism of the present invention, for ease of illustration, with the cone clutch being illustrated in an engaged condition.

Referring now primarily to FIG. 2, the retarding mechanism 33 of the present invention will be described in further detail. It should be noted that FIG. 2 is merely an enlarged view of the lower portion of FIG. 1, but with those parts removed which are not needed in connection with the description of the retarding mechanism 33. In addition, FIG. 2 is taken on a slightly different plane than the lower half of FIG. 1, so that all of the primary elements of the retarding mechanism 33 are visible at the same time in FIG. 2.

As is conventional in limited slip and locking differentials, the clutch pack 35 includes a plurality of clutch disks 39 which are splined or otherwise fixed to, or relative to, the gear case 11, and a plurality of clutch disks 41 which are splined or otherwise fixed to, or relative to, the second side gear 23. The clutch disks 39 and 41 are preferably made in a manner such that the clutch pack 35 can transmit a relatively high torque, under very heavy loading (with relatively little slipping occurring), or can periodically engage in a slipping condition, under a relatively lighter loading condition, without damage occurring to the disks 39 and 41. By way of example only, one or more of the disks may be provided with a special friction material, such as a pyrolytic carbon of the type illustrated and described in U.S. Pat. No. 4,700,823, assigned to the assignee of the present invention and incorporated herein by reference. However, it should be apparent to those skilled in the art that the construction details of the clutch pack 35 do not form any part of the present invention, and therefore, the clutch pack 35 will not be described further herein.

Disposed about the gear case 11, and partially surrounding the annular hub portion 25, is a first ball ramp actuator, generally designated 43. The actuator 43 includes an inner ramp plate 45, an outer ramp plate 47, and a plurality of cam balls 49. The terms "inner" and "outer" as used herein in regard to the ball ramp actuators will be understood to refer, respectively, to the ramp plates which are closer to ("inner") the gear case 11, as opposed to those which are further from ("outer") the gear case 11. The construction details of the first ball ramp actuator 43 (also partially shown in FIG. 3) are not essential features of the present invention, except to the extent to be described subsequently herein.

Referring still primarily to FIG. 2, disposed to the right of the first ball ramp actuator 43 is the actuating mechanism 37 which preferably comprises an annular electromagnetic coil 51 which is mounted on an annular support member 53. The support member 53 surrounds the annular hub portion 25, but is preferably fixed relative to the differential housing H, such that the actuating mechanism 37 is stationary and the gear case 11 is free to rotate therein, and relative thereto. The actuating mechanism 37, which is shown herein by way of example only, may be better understood by reference to above-incorporated U.S. Pat. No. 5,911,643. Actuation of the coil 51 occurs in response to an electrical input signal, transmitted to the coil 51 by means of a pair of electrical leads 54, the reference numeral "54" to be used hereinafter to designate either the leads or the electrical input signal.

Disposed between the outer ramp plate 47 and the coil 51 is an annular drive plate 55, which is fixed, by any suitable means, to be non-rotatable relative to the outer ramp plate 47. Therefore, as is well known to those skilled in the art, and as is illustrated and explained in the above-incorporated '643 patent, when the coil 51 is energized, the resulting flux path passes through the drive plate 55 and draws the plate 55 into frictional engagement with adjacent friction surfaces on a coil housing 57. The result is to retard rotation of the outer ball ramp plate 47, relative to the gear case 11. However, the inner ramp plate 45 is fixed to rotate with the gear case 11, such that there is a resulting relative rotation between the ramp plates 45 and 47, and therefore, a ramping action resulting in leftward axial movement in FIG. 2 of the inner ramp plate 45. This movement of the ramp plate 45 is in opposition to the force of one or more biasing springs 58, seated in a counter-bore in the gear case 11, in a manner well know to those skilled in the ball ramp actuator art.

The gear case 11 defines a plurality of axial bores 59 (i.e., parallel to the axis of rotation A), and reciprocably disposed within each bore 59 is an elongated engagement member 61, defining an axis "a" which is preferably generally parallel to the axis of rotation A. In the subject embodiment, and by way of example only, there are three of the bores 59 and members 61, uniformly spaced, circumferentially, about the gear case 11. Each engagement member 61 includes an upstream portion 63, which is disposed in engagement with the left hand surface of the inner ramp plate 45, and is surrounded by one of the biasing springs 58. Each member 61 also includes a downstream portion 65 in engagement with an annular input member 67 of a cone clutch assembly, to be described subsequently. Therefore, energization of the coil 51 and the resulting ramping action of the first ball ramp actuator 43 results in axial movement of the engagement members 61 to the left in FIG. 2, moving the input member 67 accordingly.

Referring still primarily to FIG. 2, in conjunction with FIG. 1, the second side gear 23 includes a radially-extending flange-like portion 69 which comprises an inner ramp plate (which hereinafter will bear the same reference numeral) of a second ball ramp actuator, generally designated 71. The second ball ramp actuator 71 also includes an outer ramp plate 73, and disposed between the ramp plates 69 and 73 is a plurality of cam balls 75.

Figure 2A:
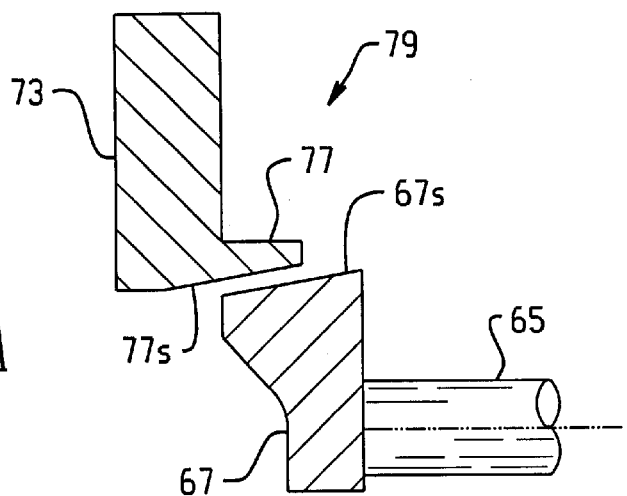
FIG. 2A is a partial view, similar to FIG. 2, showing the cone clutch assembly in a disengaged condition.

In accordance with an important aspect of the present invention, the outer ramp plate 73 includes a radially outer, axially extending, generally cylindrical portion 77. The radially outer surface of the portion 77 and the radially inner surface of the input member 67 each comprise a friction surface, such that the portion 77 and the input member 67 together comprise a cone clutch assembly, generally designated 79. Therefore, and as may best be seen in FIG. 2A, the cylindrical portion 77 includes an outer friction surface 77s and the input member 67 includes an inner friction surface 67s.

As the engagement members 61 move leftward in FIG. 2, as described previously, the annular input member 67 moves leftward and the cone clutch assembly 79 engages (i.e., moves from the disengaged condition of FIG. 2A to the engaged condition of FIG. 2), thus retarding rotation of the outer ramp plate 73, relative to the second side gear 23. The retarded rotation of the outer ramp plate 73 results in ramping action of the ramp plate 73, relative to the inner ramp plate 69, such that the ramp plate 73 moves to the left in FIG. 2, applying an axial load to the clutch pack 35. Thus, the second ball ramp actuator 71 and the cone clutch assembly 79 together comprise a clutch pack loading mechanism.

Figure 3:
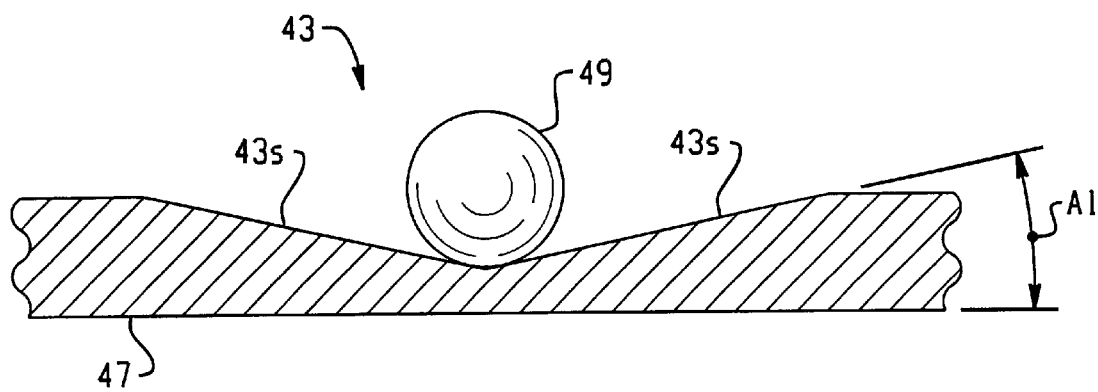
FIG. 3 is a somewhat schematic view of the first ball ramp actuator of the differential of the present invention.
Figure 4:
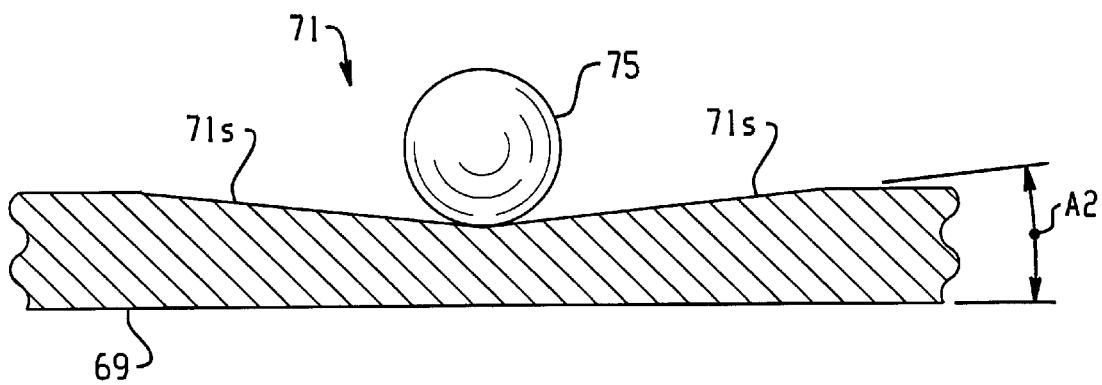
FIG. 4 is a somewhat schematic view, similar to FIG. 3, but illustrating the second ball ramp actuator of the present invention.

Referring now primarily to FIGS. 3 and 4, one important aspect of the invention will be described. In FIG. 3, the first ball ramp actuator 43 defines ramp surfaces 43s on each of the ramp plates 45 and 47. In a preferred embodiment, the ramp surfaces 43s define a first, relatively steeper ramp angle A1, which is preferably in the range of about 4 degrees to about 20 degrees. Similarly, in FIG. 4, the second ball ramp actuator 71 defines ramp surfaces 71s on each of the ramp plates 69 and 73. The ramp surfaces 71s define a second, relatively shallower ramp angle A2, which is preferably in the range of about 2 degrees to about 4 degrees. The relatively steeper ramp surfaces 43s permit the first ball ramp actuator 43 to serve as a "switch" to initiate actuation, and do so quickly, in response to energization of the coil 51, but at the same time, the relatively steeper ramp surfaces 43s permit relatively easier and quicker disengagement of the entire retarding mechanism 33, whenever such disengagement is desired.

Figure 5:
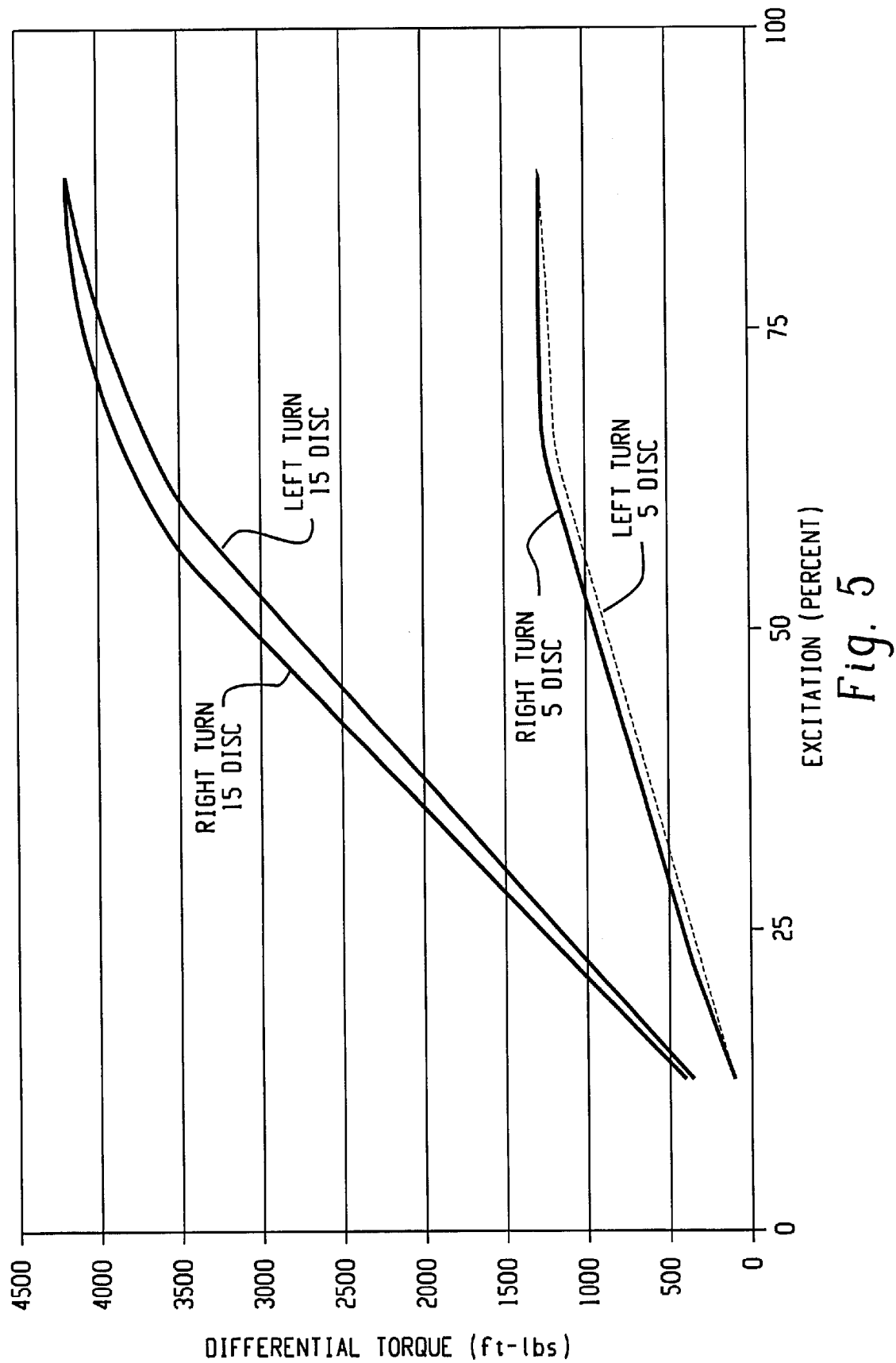
FIG. 5 is a graph of Differential Torque (bias torque) in ft-lbs as a function of Percent Excitation (i.e., the percent of maximum electrical current to the electromagnetic coil), comparing a relatively low torque (5 disc) unit and a relatively high torque (15 disc) unit.

The relatively shallower ramp surfaces 71s permit the second ball ramp actuator 71 to serve as a clutch pack loading device, with less torque required to achieve the necessary relative rotation of the ramp plates 69 and 73 than would be required if the ramp surfaces 71s were relatively steeper, thus making modulation of the bias torque easier to achieve. Referring now primarily to FIG. 5, there is presented a graph of Differential Torque in ft-lbs versus Percent Excitation, i.e., the percent of the maximum coil current which is being applied to the coil 51. What is illustrated in the graph of FIG. 5 is that with the present invention, it is possible to achieve excellent modulation of bias torque, whether at a relatively low bias torque (5 friction discs, as shown in FIG. 2), or at a relatively high bias torque (15 friction discs).

However, it should be understood by those skilled in the art that the present invention is not limited to the ramp surface arrangement described in the preceding paragraph. It would also be within the scope of the invention, for certain vehicle applications, to make the ramp surfaces 71s relatively steeper, in which case the bias torque will be applied and removed faster. Also, it would be within the scope of the invention to make both sets of ramp surfaces 43s and 71s the same ramp angle, in order to minimize the manufacturing cost of the differential.

It should be noted that a ball ramp type of actuator is preferred for use in the present invention, rather than a cam ramp type, having no separate cam members (such as cam balls 75), primarily because the ball ramp type is understood to be able to provide a greater axial loading force on the clutch pack. However, those skilled in the art will understand that the present invention is not strictly limited to the use of a ball ramp type of actuator, and that within the scope of the invention, other types of ramping actuators could be utilized.

In accordance with another aspect of the invention, the differential device illustrated and described herein can be designed to operate in only a limited slip mode, or can be designed to operate in either a limited slip or a locking mode. The primary difference between the two design approaches will lie in the choice of the number of discs in the clutch pack 35, the diameter of those discs, and the clamping force exerted by the retarding mechanism 33. As is well known, a greater area of disc engagement and/or a greater force of engagement is required to progress from a limited slip mode to a locking mode, as is represented in the graph of FIG. 5, with the 15 disc device approaching 100 percent excitation. One of the advantages of the design of the invention is that proper control of the retarding torque applied by the coil 51 to the first ball ramp actuator 43 can cause the device to continue to operate in an "intermediate" limited slip mode, rather than progressing immediately to a locking mode. Thereafter, with a greater retarding torque applied by the coil 51 to the actuator 43, the device can operate in the locking mode.

The invention has been described in great detail in the foregoing specification, and it is believed that various alterations and modifications of the invention will become apparent to those skilled in the art from a reading and understanding of the specification. It is intended that all such alterations and modifications are included in the invention, insofar as they come within the scope of the appended claims.

What is claimed is:

1. A differential gear mechanism of the type including a gear case, and defining an axis of rotation and a gear chamber; a differential gear set disposed in said gear chamber and including at least one input gear and first and second output gears; a retarding mechanism for retarding differentiating action of said differential gear set, including a clutch pack disposed adjacent said second output gear, and operable between an engaged condition, effective to retard relative rotation between said output gears and said gear case, and a disengaged condition; said retarding mechanism including a first ball ramp actuator disposed adjacent said first output gear and further including an electromagnetic actuator disposed adjacent said first ball ramp actuator and operable, in response to an electrical input signal, to cause ramping action of said first ball ramp actuator; a plurality of elongated engagement members having upstream end portions generally associated with said first ball ramp actuator and operable to move axially toward said second output gear in response to said ramping action of said first ball ramp actuator; said elongated engagement members having downstream end portions operably associated with a clutch pack loading mechanism and operable, in response to said axial movement of said engagement members to apply a load to said clutch pack tending to change said clutch pack from said disengaged condition to said engaged condition; characterized by:

(a) said clutch pack loading mechanism comprising a second ball ramp actuator disposed axially between said second output gear and said clutch pack, said second ball ramp actuator including a rotatable ramp plate; and (b) said clutch pack loading mechanism further comprising a cone clutch assembly comprising an input member, operably associated with said downstream end portions of said engagement members, and defining a first cone clutch surface and said rotatable ramp plate defining a mating, second cone clutch surface, said first and second cone clutch surfaces being moved toward engagement in response to said axial movement of said engagement members, to initiate ramping action of said second ball ramp actuator.

2. A differential gear mechanism as claimed in claim 1, characterized by said first ball ramp actuator having a first, relatively steeper ramp angle and said second ball ramp actuator having a second, relatively shallower ramp angle.

3. A differential gear mechanism as claimed in claim 2, characterized by said first, relatively steeper ramp angle is in the range of about 4 degrees to about 20 degrees.

4. A differential gear mechanism as claimed in claim 2, characterized by said second, relatively shallower ramp angle is in the range of about 2 degrees to about 4 degrees.

5. A differential gear mechanism as claimed in claim 1, characterized by said first ball ramp actuator and said electromagnetic actuator being disposed external to said gear case and mounted to permit rotation of said gear case relative to said actuators.

6. A differential gear mechanism as claimed in claim 1, characterized by each of said plurality of elongated engagement members defining an axis oriented generally parallel to said axis of rotation, each of said engagement members moving along said axis during said axial movement.

7. A differential gear mechanism as claimed in claim 1, characterized by said second ball ramp actuator comprising said second output gear including a radially-extending flange-like portion, said rotatable ramp plate being disposed axially between said flange-like portion and said clutch pack, and a plurality of balls being disposed between said flange-like portion and said rotatable ramp plate.

* * * * *